(12) United States Patent
Yen et al.

(10) Patent No.: US 9,865,671 B2
(45) Date of Patent: Jan. 9, 2018

(54) ORGANIC LIGHT-EMITTING DEVICE

(71) Applicant: Industrial Technology Research Institute, Hsinchu (TW)

(72) Inventors: Hsi-Hsuan Yen, Taipei (TW); Wen-Yung Yeh, Hsinchu County (TW); Je-Ping Hu, Hsinchu (TW); Yuan-Shan Chung, Hsinchu (TW); Chih-Ming Lai, Changhua County (TW); Hsuan-Yu Lin, Changhua County (TW); Wen-Hong Liu, Taichung (TW); Hsin-Chu Chen, Miaoli County (TW); Chun-Ting Liu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/255,156

(22) Filed: Sep. 2, 2016

(65) Prior Publication Data

US 2017/0069703 A1    Mar. 9, 2017

Related U.S. Application Data

(60) Provisional application No. 62/213,624, filed on Sep. 3, 2015, provisional application No. 62/278,466, filed on Jan. 14, 2016.

(30) Foreign Application Priority Data

Nov. 23, 2015 (TW) .............................. 104138827 A
May 13, 2016 (CN) .......................... 2016 1 0316537

(51) Int. Cl.
*H01L 27/32* (2006.01)
*H01L 23/525* (2006.01)

(52) U.S. Cl.
CPC ...... *H01L 27/3276* (2013.01); *H01L 23/5256* (2013.01); *H01L 27/3288* (2013.01); *H01L 2251/568* (2013.01)

(58) Field of Classification Search
CPC ............. H01L 27/3276; H01L 27/3288; H01L 23/5256; H01L 2251/568
See application file for complete search history.

(56) References Cited

U.S. PATENT DOCUMENTS 6,812,637 B2  11/2004  Cok et al.
7,098,591 B1   8/2006  Zhu et al.
(Continued)

FOREIGN PATENT DOCUMENTS

CN    101194538    6/2008
CN    102569338    7/2012
(Continued)

OTHER PUBLICATIONS

Oostra et al., "Prevention of short circuits in solution-processed OLED devices," Organic Electronics, Mar. 2014, pp. 1166-1172.
(Continued)

*Primary Examiner* — Roy Potter
*Assistant Examiner* — Paul Patton
(74) *Attorney, Agent, or Firm* — JCIPRNET

(57) ABSTRACT

An organic light-emitting device includes a first substrate, a light-emitting structure layer, a first electrode layer, a second electrode layer, a second substrate, first conduction members, a second conduction member and protection structures. The light-emitting structure layer is disposed on the first substrate. The first electrode layer is disposed on the light-emitting structure layer and includes pad-like patterns. The second electrode layer is disposed between the light-emitting structure layer and the first substrate. The second substrate is adhered on the first electrode layer and includes
(Continued)

a first circuit and a second circuit. The first circuit includes a continuous pattern and contact portions. The first conduction members are connected between the first circuit and the first electrode layer. The second conduction member is connected between the second circuit and the second electrode layer. The protection structures respectively form open circuits or close circuits between the contact portions and the continuous pattern.

23 Claims, 10 Drawing Sheets

(56) References Cited

U.S. PATENT DOCUMENTS

| | | | |
|---|---|---|---|
| 7,518,148 | B2 | 4/2009 | Liu et al. |
| 7,583,022 | B2 | 9/2009 | Cok |
| 7,750,558 | B2 | 7/2010 | Cok |
| 8,203,263 | B2 | 6/2012 | Langguth et al. |
| 8,836,223 | B2 | 9/2014 | Levermore et al. |
| 9,035,420 | B2 | 5/2015 | Lee et al. |
| 9,214,510 | B2 | 12/2015 | Ma et al. |
| 2012/0181933 | A1* | 7/2012 | Ma .................. H01L 27/3281 315/121 |
| 2012/0286298 | A1 | 11/2012 | Pang et al. |
| 2014/0034920 | A1 | 2/2014 | Lee et al. |
| 2014/0224322 | A1 | 8/2014 | Takeda et al. |
| 2014/0306210 | A1 | 10/2014 | Lee et al. |
| 2014/0306214 | A1 | 10/2014 | Lee et al. |
| 2014/0332780 | A1* | 11/2014 | Hack .................. H01L 27/3281 257/40 |

FOREIGN PATENT DOCUMENTS

| | | |
|---|---|---|
| CN | 202425138 | 9/2012 |
| CN | 203352883 | 12/2013 |
| EP | 2172991 | 4/2010 |
| TW | 200717890 | 5/2007 |
| TW | 201117451 | 5/2011 |
| TW | 201220488 | 5/2012 |

OTHER PUBLICATIONS

Joerg Amelung, "Large-area organic light-emitting diode technology," SPIE Newsroom, Apr. 2008, pp. 1-2.
Choi et al., "ITO-free large-area organic light-emitting diodes with an integrated metal grid," Optics Express, Jun. 2011, pp. 1-11.
Barink et al., "Analytical model for current distribution in large-area organic light emitting diodes with parallel metal grid lines," Journal of Applied Physics, Sep. 2012, pp. 054507-1-054507-7.
Park et al., "Luminance Uniformity of Large-Area OLEDs With an Auxiliary Metal Electrode," Journal of Display Technology, Aug. 2009, pp. 306-311.
Tak et al., "Criteria for ITO (indium-tin-oxide) thin film as the bottom electrode of an organic light emitting diode," Thin Solid Films, May 2002, pp. 12-16.
Tadatsugu Minami, "Present status of transparent conducting oxide thin-film development for Indium-Tin-Oxide (ITO) substitutes," Thin Solid Films, Oct. 2007, pp. 5822-5828.
Catro-Rodriguez et al., "Effect of indium tin oxide substrate roughness on the morphology, structural and optical properties of CdS thin films," Applied Surface Science, Jul. 2000, pp. 340-346.
Marks et al., "Progress in high work function TCO OLED anode alternatives and OLED nanopixelation," Synthetic Metals, Mar. 2002, pp. 29-35.
Park et al., "Characteristics of Organic Light Emitting Diodes with Al-Doped ZnO Anode Deposited by Atomic Layer Deposition," Japanese Journal of Applied Physics, Jan. 2005, pp. L242-L245.

* cited by examiner

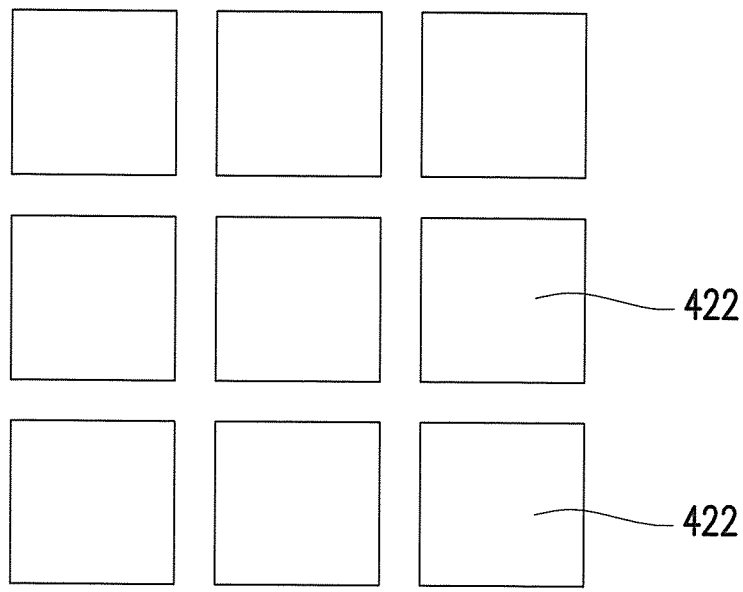
FIG. 4    420
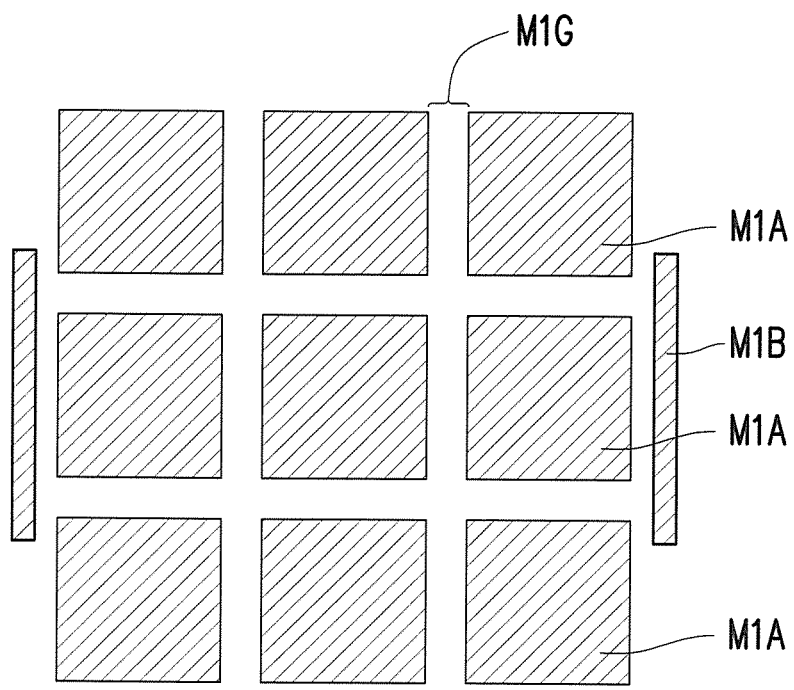
FIG. 5    M1

ORGANIC LIGHT-EMITTING DEVICE

CROSS-REFERENCE TO RELATED APPLICATION

This application claims the priority benefits of U.S. provisional application Ser. No. 62/213,624, filed on Sep. 3, 2015, U.S. provisional application Ser. No. 62/278,466, filed on Jan. 14, 2016, Taiwan application serial no. 104138827, filed on Nov. 23, 2015, and China application serial no. 201610316537.8, filed on May 13, 2016. The entirety of each of the above-mentioned patent applications is hereby incorporated by reference herein and made a part of this specification.

BACKGROUND OF THE DISCLOSURE

Field of the Disclosure

The disclosure relates to an organic light-emitting device.

Description of Related Art

Along with development of photoelectric technology, performance and quality of organic light-emitting devices are continually improved for applying in various applications. For example, a large-area organic light-emitting device can be applied in a light-emitting apparatus used for providing a planar light source. Generally, the organic light-emitting device has an anode layer, a cathode layer and a light-emitting structure layer interposed between the anode layer and the cathode layer. The large-area organic light-emitting device probably has an uneven current distribution during operation, so that a local part of the large-area organic light-emitting device may have a current crowding phenomenon. The current crowding phenomenon may result in a temperature rise of the local part, or even cause the device damage. Moreover, due to a manufacturing process or instability of material, a short circuit may occur at the local part. In case that the cathode and the anode of different polarities are respectively electrode layers entirely covering the main surface of the device, the local short circuit or open circuit of a signal spot may cause a damage of the whole device.

SUMMARY OF THE DISCLOSURE

An embodiment of the disclosure provides an organic light-emitting device including a first substrate, a light-emitting structure layer, a first electrode layer, a second electrode layer, a second substrate, a plurality of first conduction member, a second conduction member and a plurality of protection structures. The light-emitting structure layer is disposed on the first substrate. The first electrode layer is disposed on the light-emitting structure layer, and the first electrode layer includes a plurality pad-like patterns. The pad-like patterns are separated from each other. The second electrode layer is disposed between the light-emitting structure layer and the first substrate. The second substrate is adhered on the first electrode layer. The second substrate includes a first circuit and a second circuit. The first circuit and the second circuit are electrically independent to each other, and the first circuit includes a continuous pattern and a plurality of contact portions. The contact portions and the continuous pattern are separated by a plurality of openings. The first conduction members are connected between the first circuit and the first electrode layer. The second conduction member is connected between the second circuit and the second electrode layer. The protection structures respectively form open circuits or close circuits between the contact portions and the continuous pattern.

In order to make the aforementioned and other features of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4 is a schematic top view of a first electrode layer of the organic light-emitting device of FIG. 3.

FIG. 5 is a schematic top view of a first conductive layer in a second substrate of FIG. 3.

DESCRIPTION OF EMBODIMENTS

Figure 1A:
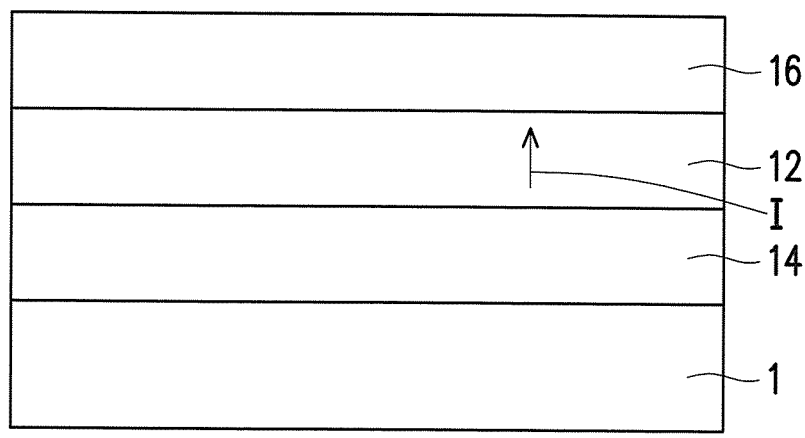
FIG. 1A is a cross-sectional view of an organic light-emitting device according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1A is a cross-sectional view of an organic light-emitting device according to an embodiment of the disclosure. As shown in FIG. 1A, the organic light-emitting device 10 includes a substrate 1, a light-emitting structure layer 12, a first electrode layer 14 and a second electrode layer 16. The organic light-emitting device 10 can be formed on the substrate 1, and the substrate 1 can be a circuit board, a transparent substrate, a flexible substrate or other plate-like object capable of carrying the light-emitting structure layer 12, the first electrode layer 14 and the second electrode layer 16. The light-emitting structure layer 12 is interposed between the first electrode layer 14 and the second electrode layer 16.

In an embodiment, the first electrode layer 14 and the second electrode layer 16 can be respectively a cathode and an anode. For example, the first electrode layer 14 is the anode and the second electrode layer 16 is the cathode, during an operation period of the organic light-emitting device 10, a current I produced when a driving signal is input to the first electrode layer 14 and the second electrode layer 16 may flow from the first electrode layer 14 serving as the anode to the second electrode layer 16 serving as the cathode, and penetrate through the light-emitting structure layer 12 to make the light-emitting structure layer 12 to emit light. Now, electrons are injected from the cathode and holes are injected from the anode. In the organic light-emitting device 10, the first electrode layer 14 or the second electrode layer 16 serving as the cathode can be made of a metal material, and the metal material is, for example, aluminium. Moreover, the first electrode layer 14 or the second electrode layer 16 serving as the anode can be made of a transparent conductive layer. In an embodiment, the transparent conductive layer can be a metal layer having a grid-like structure, a conductive layer made of a transparent conductive material or a composite transparent conductive layer formed by stacking the grid-like metal layer on the conductive layer of the transparent material. The transparent conductive material can be an inorganic conductive material such as indium oxide, tin oxide, indium tin oxide, indium zinc oxide, etc., or an organic conductive material. In other embodiments, at least one of the first electrode layer 14 and the second electrode layer 16 is composed of a solid conductive layer and a fine grid metal layer stacked thereon.

The light-emitting structure layer 12 includes an organic light-emitting layer having a photoelectric conversion property, which is used for converting electric energy into light energy, and the light-emitting structure layer 12 further includes an electron transmission layer, an electron injection layer, a hole transmission layer and a hole injection layer or a combination of the above functional film layers. The electron transmission layer and the electron injection layer are adapted to be located at a first side of the light-emitting layer 12, and the hole transmission layer and the hole injection layer are adapted to be located at a second side of the light-emitting layer 12, where the first side is opposite to the second side.

The first electrode layer 14 and the second electrode layer 16 are all made of conductive materials and have an electrical conduction property. The current I generated between the first electrode layer 14 and the second electrode layer 16 can be evenly distributed in the light-emitting structure layer 12 through adjusting a layout of the electrode layers to facilitate emitting lights. Distribution of the current I is required to have ideal evenness for the organic light-emitting device 10 to serve as a planar light source. In case that the distribution of the current I is uneven, a part of the light-emitting structure layer 12 may have the current I with a higher density than other parts, and may induce a stronger emitted light, which may result in generation of bright spots, i.e. result in an uneven light-emitting effect. Such uneven light-emitting effect cannot satisfy a light-emitting demand of the organic light-emitting device 10. Moreover, a temperature of the current concentration part of the light-emitting structure layer 12 is increased. When the temperature is increased to exceed a tolerance limit of the light-emitting structure layer 12, the high temperature may damage the organic light-emitting device 10. However, the current concentration phenomenon is caused by many factors. Therefore, the organic light-emitting device 10 needs some designs to avoid the damage caused by uneven current distribution.

Figure 1B:
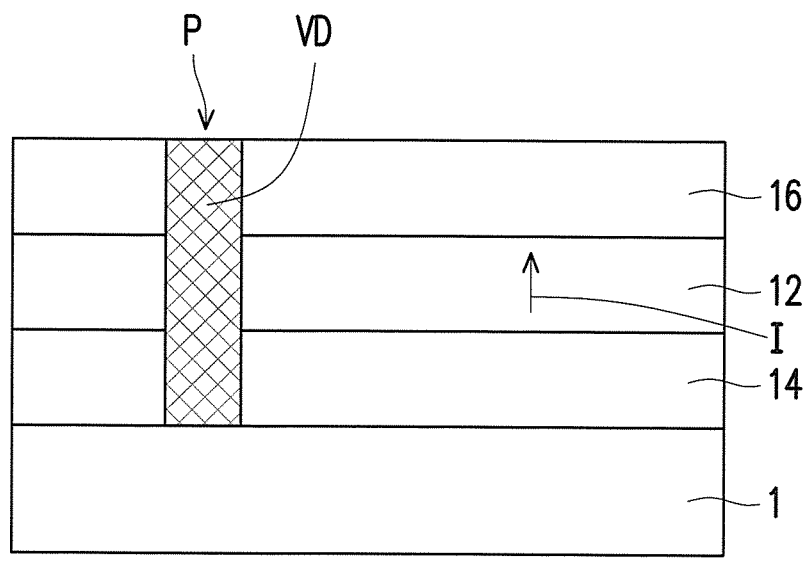
FIG. 1B is a top view of a repaired organic light-emitting device according to and embodiment of the disclosure.

In addition, the current concentration phenomenon may be repaired according to a result of a quality test. Specifically, the quality test may be performed after the organic light-emitting device 10 is made. During the quality test, the organic light-emitting device 10 is enabled to emit light and the illumination effect is simultaneously detected. Once an extraordinary point is detected, a repairing process can be performed on the extraordinary point as a target point. In one instance, the extraordinary point may have a length or a width of about 1 mm and the repairing process includes an optical treatment which irradiates an optical beam such as a laser beam onto the target point. A portion of the organic light-emitting device 10 at the target point P is burned out so that a void VD as shown in FIG. 1B is formed at the target point P. After the repairing process, the organic light-emitting device 10' may have the void VD located at the position of the target point P while other portions of the organic light-emitting device 10' can normally perform, such that the organic light-emitting device 10' can provide the predetermined function and pass the quality test.

Figure 2:
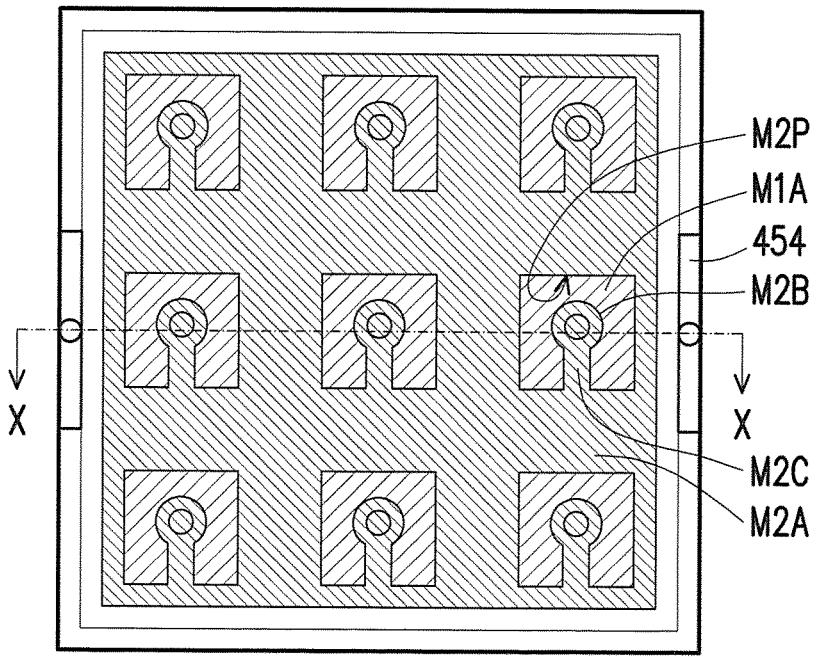
FIG. 2 is a schematic top view of an organic light-emitting device according to an embodiment of the disclosure.
Figure 3:
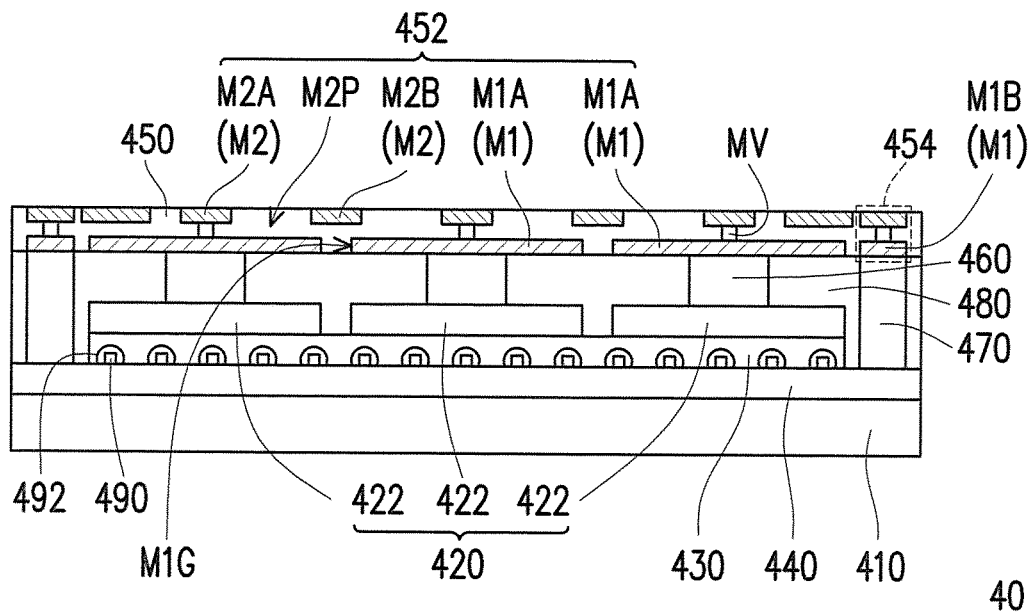
FIG. 3 is a schematic cross-sectional view of FIG. 2 along a section line X-X.

FIG. 2 is a top view of an organic light-emitting device according to an embodiment of the disclosure, and FIG. 3 is a cross-sectional view of FIG. 2 along a section line X-X. Referring to FIG. 2 and FIG. 3, the organic light-emitting device 400 includes a first substrate 410, a second electrode layer 440, a light-emitting structure layer 430, a first electrode layer 420, a second substrate 450, first conduction members 460, a second conduction member 470 and a sealing layer 480. The second electrode layer 440, the light-emitting structure layer 430 and the first electrode layer 420 are sequentially stacked on the first substrate 410. Namely, the light-emitting structure layer 430 is located between the first electrode layer 420 and the second electrode layer 440 and the second electrode layer 440 is located between the light-emitting structure layer 430 and the first substrate 410. An orthogonal projection area of the second electrode layer 440 is greater than an orthogonal projection area of the light-emitting structure layer 430 and an orthogonal projection area of the first electrode layer 420, such that the orthogonal projection area of the light-emitting structure layer 430 and the orthogonal projection area of the first electrode layer 420 both fall within the orthogonal projection area of the second electrode layer 440. The second substrate 450 is adhered on the first electrode layer 420. A first conductive layer M1 and a second conductive layer M2 are configured in the second substrate 450, and the first conductive layer M1 and the second conductive layer M2 are used for constructing a first circuit 452 and a second circuit 454. The first circuit 452 is electrically connected to the first electrode layer 420 through the first conduction members 460. The second conduction member 470 is connected between the second circuit 454 and the second electrode layer 440, such that the second circuit 454 is electrically connected to the second electrode layer 440 through the second conduction member 470. The sealing layer 480 is disposed between the first substrate 410 and the second substrate 450, and the first conduction members 460 and the second conduction member 470 all penetrate through the sealing layer 480. Meanwhile, the first conductive layer M1 is located between the second conductive layer M2 and the first conduction members 460. The first conductive layer M1 is closer to the first electrode layer 420 compared to the second conductive layer M2, and the first conductive layer M1 is exposed on a surface of the second substrate 450. The first conductive layer M1 includes a plurality of first conductive patterns M1A and a plurality of second conductive patterns M1B, where the first conductive patterns M1A are used for constructing a part of the first circuit 452 exposed on the second substrate 450, and the second conductive patterns M1B are used for constructing a part of the second circuit 454 exposed on the second substrate 450. Each of the first conductive patterns M1A is connected to one of pad-like patterns 422 through one corresponding first conduction member 460, and each of the second conductive patterns M1B is connected to the second electrode layer 440 through one corresponding second conduction member 470.

Materials and properties of the first substrate 410, the second electrode layer 440, the light-emitting structure layer 430 and the first electrode layer 420 may refer to related description of the substrate 1, the light-emitting structure layer 12, the first electrode layer 14 and the second electrode layer 16 of the aforementioned embodiment. The first conduction members 460 and the second conduction members 470 can be made of conductive materials to provide the required electrical conduction property. The number of the second conduction members 470 can be one or plural. When the number of the second conduction member 470 is plural, the second conductive members 470 can be distributed around the organic light-emitting device 40 in a ring shape. The sealing layer 480 can be made of a material having a moisture barrier function, and the sealing layer 480 may cover a sidewall of the light-emitting structure layer 430. The second substrate 450 can be a circuit board. Moreover, in order to acquire enough light transmittance, the second electrode layer 440 is generally made of a transparent conductive material, for example, conductive metal oxide. Now, the organic light-emitting device 40 may selectively include transmission lines 490, and the transmission lines 490 can be thread-like structures made of a metal material. The transmission lines 490 may construct a grid on the second electrode layer. In an embodiment, when the transmission lines 490 are connected to foil ii a grid-like structure, the organic light-emitting device 40 may further include grid-like insulation structures 492 disposed between the transmission lines 490 and the light-emitting structure layer 430. The insulation structures 492 can be disposed along trajectories of the transmission lines 490, and a width of the insulation structure 492 can be greater than a line width of the transmission line 490. However, the insulation structures 492 do not completely cover the second electrode layer 440, but exposes partial area of the second electrode layer 440 to allow the second electrode layer 440 to contact the light-emitting structure layer 430.

FIG. 4 is a top view of the first electrode layer of the organic light-emitting device of FIG. 3. According to FIG. 3 and FIG. 4, it is known that in the present embodiment, the first electrode layer 420 includes a plurality of independent pad-like patterns 422, and the pad-like patterns 422 are separated from each other. Orthogonal projection areas of all of the pad-like patterns 422 may cover most of the orthogonal projection area of the light-emitting structure layer 430 without exceeding the orthogonal projection area of the light-emitting structure layer 430. In this way, regions corresponding to the pad-like patterns 422 can allow current to pass therethrough to serve as a light-emitting area. Moreover, the pad-like patterns 422 are not connected to each other in structure, so that when an abnormal phenomenon occurs at the orthogonal projection area of one of the pad-like patterns 422, as long as electrical conduction of such pad-like pattern 422 is cut off, the abnormal phenomenon can be eliminated, and normal operation of the orthogonal projection areas of the other pad-like patterns 422 can be maintained. Therefore, the individual design of the pad-like patterns 422 may provide a protection mechanism to the organic light-emitting device 40.

FIG. 5 is a top view of the first conductive layer in the second substrate of FIG. 3. Referring to FIG. 5, in an embodiment, the orthogonal projection areas of the pad-like patterns 422 and the first conductive patterns M1A can be overlapped with each other, and sizes of the orthogonal projection areas of the above two types of patterns can be one large and one small or equivalent. Moreover, the first conductive patterns M1A have a gap M1G between two adjacent ones. Namely, the first conductive patterns M1A are separated from each other, and each of the first conductive patterns M1A is correspondingly connected to a single pad-like pattern 422 to construct a single electrical transmission path.

Figure 6:
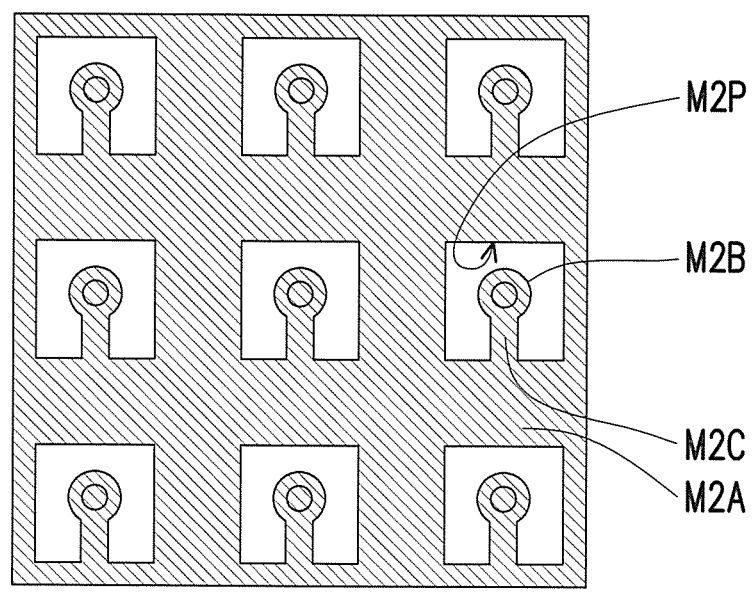
FIG. 6 is a schematic top view of a second conductive layer in a second substrate of FIG. 3.
Figure 7:
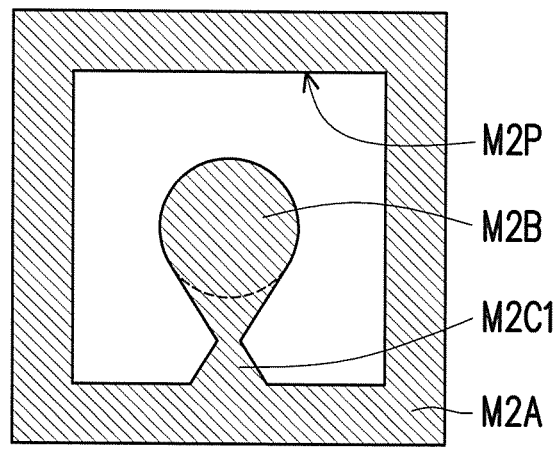
FIG. 7 is a schematic partial top view of the second conductive layer according to an embodiment of the disclosure.
Figure 8:
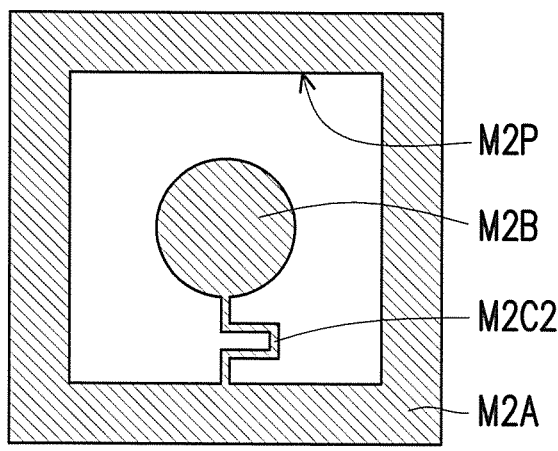
FIG. 8 is a schematic partial top view of a second conductive layer according to another embodiment of the disclosure.

FIG. 6 is a top view of the second conductive layer in the second substrate of FIG. 3. Referring to FIG. 2, FIG. 3 and FIG. 6, it is known that the second conductive layer M2 includes a continuous pattern M2A, a plurality of contact portions M2B and a plurality of protection structures M2C used for connecting the contact portions M2B to the continuous pattern M2A. The second conductive layer M2 has a plurality of openings M2P for separating the contact portions M2B and the continuous pattern M2A. Each of the openings M2P surrounds one contact portion M2B to define contours of the contact portion M2B and the corresponding protection structure M2C. The continuous pattern M2A occupies most of the area. According to FIG. 2 and FIG. 3, the continuous pattern M2A shields the gap M1G between the first conductive patterns M1A in the first conductive layer M1. Meanwhile, orthogonal projection areas of the opening M2P are overlapped with the orthogonal projection areas of the first conductive patterns M1A in the first conductive layer M1, and the orthogonal projection areas of the opening M2P may even completely fall within the orthogonal projection areas of the first conductive patterns M1A. In this way, the orthogonal projection areas of the first conductive layer M1 and the orthogonal projection areas of the second conductive layer M2 may completely cover the whole orthogonal projection area of the light-emitting structure layer 430 to provide the moisture barrier function, such that the light-emitting structure layer 430 is not easy to be influence by external moisture to cause a damage or deterioration.

In the present embodiment, the contact portions M2B are correspondingly located above the first conductive patterns M1A of the first conductive layer M1. Moreover, in FIG. 3, the contact portions M2B can be connected to the corresponding first conductive patterns M1A through conductive through holes MV in the second substrate 450. Moreover, according to FIG. 2 to FIG. 6, it is known that the protection structure M2C is used for connecting one of the contact portions M2B to the continuous pattern M2A. Therefore, one of the pad-like patterns 422, one of the first conduction members 460, one of the conductive through holes MV, one of the first conductive patterns M1A, one of the contact portions M2B and one of the protection structures M2C may construct an individual electrical transmission path between the pad-like pattern 422 and the continuous pattern M2A.

In the present embodiment, a temperature tolerance of the protection structures M2C can be controlled within a setting range, and in the electrical transmission path constructed by the pad-like pattern 422, the first conduction member 460, the first conductive pattern M1A, the conductive through hole MV, the contact portion M2B, the protection structure M2C and the continuous pattern M2A, the protection structure M2C can be a portion with lower temperature tolerance. Once a certain electrical transmission path constructed by the pad-like pattern 422, the first conduction member 460, the first conductive pattern M1A, the conductive through hole MV, the contact portion M2B, the protection structure M2C and the continuous pattern M2A has a current crowding phenomenon to cause a temperature rising phenomenon, and the temperature is increased to be greater than the temperature tolerance of the protection structure M2C of the electrical transmission path, the protection structure M2C of the electrical transmission path is probably melted to form an open circuit. The protection structure M2C is used for forming a current path between the contact portion M2B and the continuous pattern M2A before being melted. In this way, the protection structure M2C may provide a protection function to avoid damaging the organic light-emitting device 40.

Figure 9:
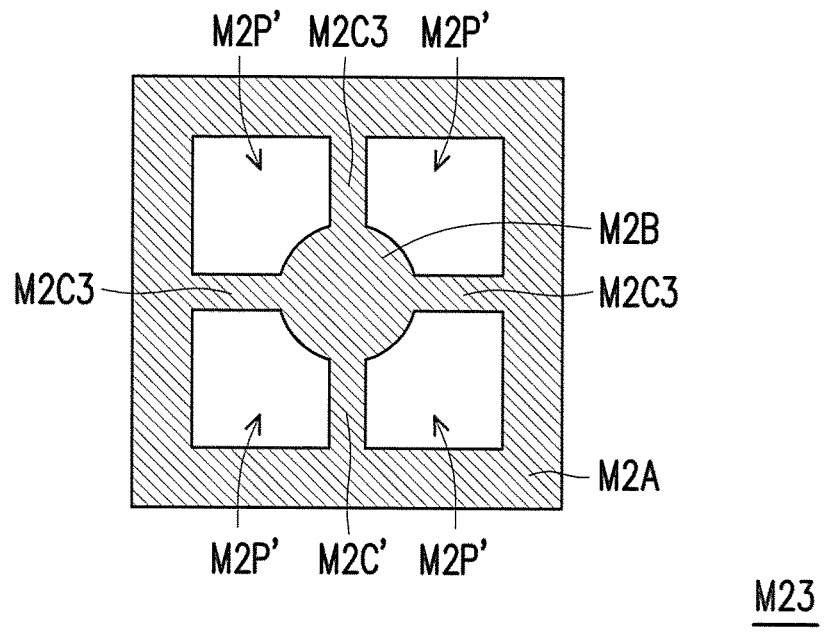
FIG. 9 is a schematic partial top view of a second conductive layer according to an embodiment of the disclosure.

The temperature tolerance of the protection structure M2C can be controlled through a line width of the protection structure M2C or a cross-sectional area of the protection structure M2C parallel to a line width direction. When the temperature tolerance of the protection structure M2C is required to be lower, the line width of the protection structure M2C or the cross-sectional area of the protection structure M2C parallel to the line width direction can be decreased to provide the required protection function. Moreover, the temperature tolerance of the protection structure M2C can also be controlled by extending a wiring path or through other methods. For example, a pattern design of the protection structure M2C may refer to a second conductive layer M21 of FIG. 7, where the contact portion M2B is connected to the continuous pattern M2A through a non-single line width protection structure M2C1. Now, the line width of the protection structure M2C1 can be decreased from an end portion towards a center to form a dumbbell shape. Alternatively, referring to FIG. 8, in the second conductive layer M22, the contact portion M2B can be connected to the continuous pattern M2A through a zigzag protection structure M2C2. Moreover, FIG. 9 is a partial top view of a second conductive layer according to an embodiment of the disclosure. In FIG. 9, in the second conductive layer M23, the contact portion M2B is connected to the continuous pattern M2A through a plurality of protection structures M2C3. Now, in the second conductive layer M23, a plurality of openings M2P' is formed to correspond to the same contact portion M2B, and the openings M2P' are separated by the protection structures M2C3. Each of the protection structures M2C3 may have similar temperature tolerance. Under a high temperature, all of the protection structures M2C3 can be melted to form an open circuit between the contact portion M2B and the continuous pattern M2A to provide the required protection function. Now, these openings M2P' can be connected to each other through the broken protection structures M2C3. In FIG. 2 and FIG. 6 to FIG. 9, although an appearance of each of the openings M2P and the openings M2P' substantially has a square contour, the disclosure is not limited thereto. In other embodiments, the appearance of each of the openings M2P and the openings M2P' can be similar to other polygons, similar to a round shape, similar to an oval shape, etc. Moreover, configuration positions of the protection structures M2C, M2C1, M2C2 and the protection structures M2C3 in the openings M2P and M2P' can also be changed along with different designs as long as the protection structures M2C, M2C1, M2C2 and the protection structures M2C3 can be melted under a predetermined temperature range.

In another embodiment, the protection structures M2C, M2C1, M2C2 and M2C3 may have variable resistance values through material selection, and the variable resistance values are increased along with temperature increase of the protection structures M2C, M2C1, M2C2 and M2C3. For example, the protection structures M2C, M2C1, M2C2 and M2C3 can be made of a material with variable resistance value, and the resistance value of such material can be increased along with increase of the temperature, such that under a normal operation temperature, a specific amount of current is allowed to flow therethrough. For example, in the organic light-emitting device 40, when a current flowing through one of the protection structures M2C, M2C1, M2C2 and M2C3 is increased, a corresponding portion emits an enhanced light to result in temperature increase. Along with the temperature increase, the impedance of the corresponding protection structures M2C, M2C1, M2C2 and M2C3 is also increased to limit a flowing amount of the current. Therefore, a current concentration effect is mitigated to avoid damage caused by high temperature.

Moreover, the protection structures M2C, M2C1, M2C2 and M2C3 can be made of a material substantially having a constant resistance value, though the protection structures M2C, M2C1, M2C2 and M2C3 may influence an electric transmission. For example, the material of the protection structures M2C, M2C1, M2C2 and M2C3 has a property of wrapping conductive elements in the case of temperature increase. Therefore, when any one of the protection structures M2C, M2C1, M2C2 and M2C3 of the organic light-emitting device 40 has a high temperature, the corresponding protection structures M2C, M2C1, M2C2 and M2C3 may wrap more conductive elements due to the material property to decrease the electrical conduction of the protection structures M2C, M2C1, M2C2 and M2C3. In this way, the current flowing through the protection structures M2C, M2C1, M2C2 and M2C3 is limited to avoid the current concentration effect.

When the electrical transmission path constructed by the pad-like pattern 422, the first conduction member 460, the first conductive pattern M1A, the conductive through hole MV, the contact portion M2B, the protection structure M2C, M2C1, M2C2 or M2C3 and the continuous pattern M2A involves a current crowding phenomenon to cause the temperature increase, based on the characteristic that the resistance value of the protection structure M2C, M2C1, M2C2 or M2C3 varies along with temperature, the resistance value of the protection structure M2C, M2C1, M2C2 or M2C3 is increased to suppress the amount of the current. In this way, the electrical transmission path constructed by the pad-like pattern 422, the first conduction member 460, the first conductive pattern M1A, the conductive through hole MV, the contact portion M2B, the protection structure M2C, M2C1, M2C2 or M2C3 and the continuous pattern M2A only allows a tiny current to flow therethrough or even does not allow any current to flow therethrough. Since the protection structure M2C, M2C1, M2C2 or M2C3 suppress the current flow, the current crowding phenomenon is also suppressed.

In the aforementioned embodiment, the aforementioned protection structures may all provide the protection effect to serve as a protection assembly to form an open circuit when the current flowing therethrough is greater than a threshold value. In the aforementioned embodiment, the characteristic that the temperature tolerance of the protection structure is relatively low is adopted to provide the protection effect. Under the same current, when the material of the protection structure has higher resistivity, the temperature rising phenomenon is more obvious, and conversely the temperature rising phenomenon is less obvious. Therefore, during a process of manufacturing the organic light-emitting device, the protection structure can be designed according to the material of the protection structure, the amount of the pad-like patterns in the electrode layer and a default operation current of the organic light-emitting device. For example, when the protection structure M2C, M2C1, M2C2 or M2C3 of the aforementioned embodiment is made of copper, a thickness thereof is ½ ounce and a line width thereof is 0.01 inch to 0.025 inch, the current that can be withstood by the protection structure M2C, M2C1, M2C2 or M2C3 is about 500 mA to 900 mA. Therefore, a designer may implement the protection structure through a selected material and a size design of the structure. For example, current tolerances presented by lead wires made of a copper material are shown as a following table 1.

TABLE 1

| Line width (inch) | Temperature increase | | | | | | | | |
|---|---|---|---|---|---|---|---|---|---|
| | 10° C. | | | 20° C. | | | 30° C. | | |
| | Copper wire thickness (ounce, oz) | | | | | | | | |
| | 0.5 | 1 | 2 | 0.5 | 1 | 2 | 0.5 | 1 | 2 |
| | Maximum current (ampere, A) | | | | | | | | |
| 0.01 | 0.5 | 1 | 1.4 | 0.6 | 1.2 | 1.6 | 0.7 | 1.5 | 2.2 |
| 0.015 | 0.7 | 1.2 | 1.6 | 0.8 | 1.3 | 2.4 | 1 | 1.6 | 3 |
| 0.02 | 0.7 | 1.3 | 2.1 | 1 | 1.7 | 3 | 1.2 | 2.4 | 3.6 |
| 0.025 | 0.9 | 1.7 | 2.5 | 1.2 | 2.2 | 3.3 | 1.5 | 2.8 | 4 |
| 0.03 | 1.1 | 1.9 | 3 | 1.4 | 2.5 | 4 | 1.7 | 3.2 | 5 |
| 0.05 | 1.5 | 2.6 | 4 | 2 | 3.6 | 6 | 2.6 | 4.4 | 7.3 |
| 0.075 | 2 | 3.5 | 5.7 | 2.8 | 4.5 | 7.8 | 3.5 | 6 | 10 |
| 0.1 | 2.6 | 4.2 | 6.9 | 3.5 | 6 | 9.9 | 4.3 | 7.5 | 12.5 |
| 0.2 | 4.2 | 7 | 11.5 | 6 | 10 | 11 | 7.5 | 13 | 20.5 |
| 0.25 | 5 | 8.3 | 12.3 | 7.2 | 12.3 | 20 | 9 | 15 | 24 |

When an overall driving current of the whole organic light-emitting device is X, and the amount of the pad-like patterns is N, the protection structure can be designed according to the material property of the protection structure to allow a current smaller than or equal to X/N to flow therethrough, and when the current is greater than X/N and smaller than X, the protection structure is melted to form an open circuit.

In other words, the function of the protection structure is similar to a function of a fuse, and the protection structure is integrated into the original electrode layer or conductive layer. However, in order to provide the same protection effect, the organic light-emitting device may have other protection designs.

Figure 10:
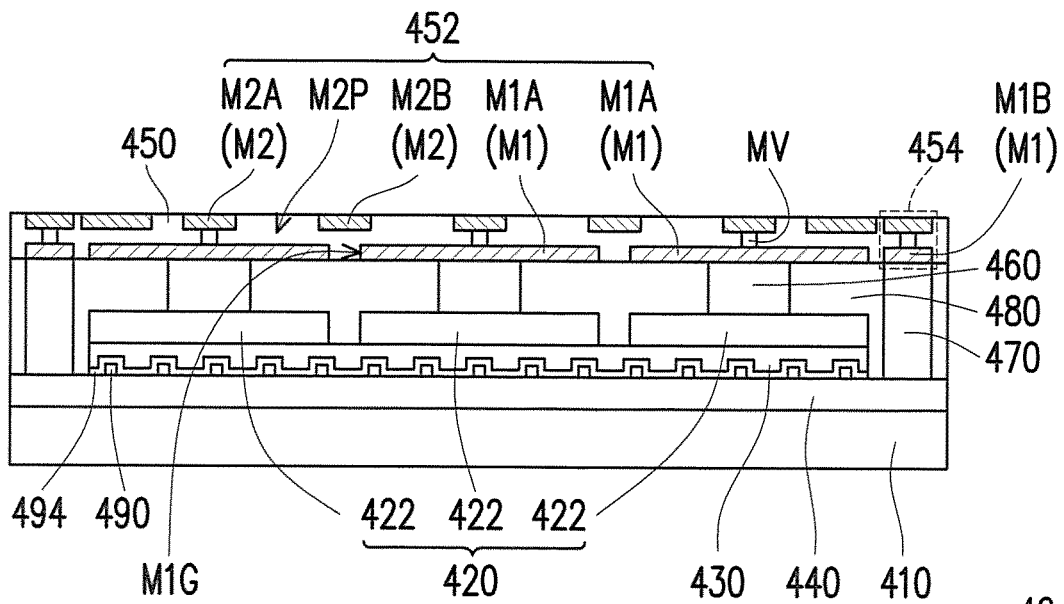
FIG. 10 is a schematic cross-sectional view of an organic light-emitting device according to another embodiment of the disclosure.

FIG. 10 is a cross-sectional view of an organic light-emitting device according to another embodiment of the disclosure. Referring to FIG. 10, the organic light-emitting device 42 is similar to the organic light-emitting device 40 of the aforementioned embodiment, and includes the first substrate 410, the second electrode layer 440, the light-emitting structure layer 430, the first electrode layer 420, the second substrate 450, the first conduction members 460, the second conduction member 470, the sealing layer 480, the transmission lines 490 and an auxiliary conductive layer 494. The first substrate 410, the second electrode layer 440, the light-emitting structure layer 430, the first electrode layer 420, the second substrate 450, the first conduction members 460, the second conduction member 470, the sealing layer 480 and the transmission lines 490 may refer to related descriptions of FIG. 2 to FIG. 6, and details thereof are not repeated. In the present embodiment, the auxiliary conductive layer 494 is disposed between the second electrode layer 440 and the light-emitting structure layer 430, and covers the transmission lines 490. A material of the auxiliary conductive layer 494 may include a transparent conductive material, for example, indium zinc oxide, indium tin oxide, indium oxide, tin oxide, an organic conductive material, etc. In the present embodiment and the embodiment of FIG. 3, the auxiliary conductive layer 494 and the insulation structures 492 are all used for covering the transmission lines 490. Therefore, when the transmission lines 490 have sharp surfaces, the auxiliary conductive layer 494 and the insulation structures 492 may smooth over the sharp structures. Therefore, when the light-emitting structure layer 430 and the first electrode layer 420 are fabricated subsequently, the light-emitting structure layer 430 is not liable to be pierced by the sharp surfaces of the transmission lines 490 to cause an electrical connection of the transmission lines 490 and the first electrode layer 420. In other words, the auxiliary conductive layer 494 and the insulation structures 492 cover the transmission lines to avail improving reliability of the optical light-emitting device.

Figure 11:
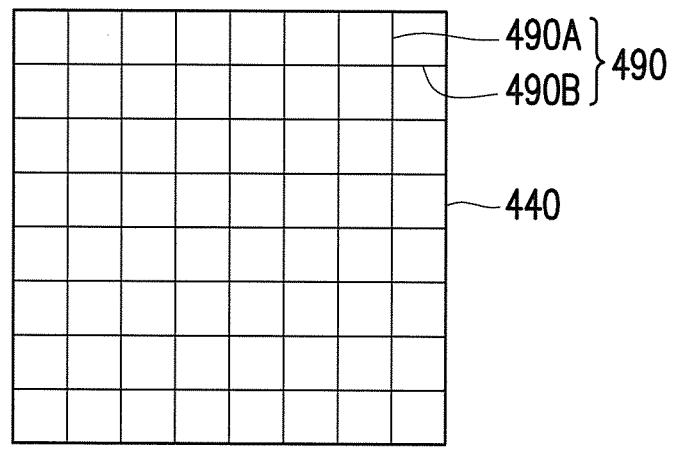
FIG. 11 is a schematic diagram of a grid structure of transmission lines according to an embodiment of the disclosure.
Figure 12A:
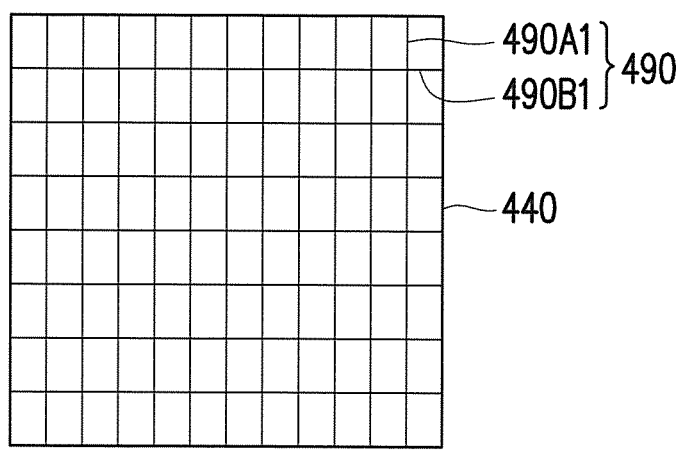
FIG. 12A through FIG. 12C are schematic diagrams of grid structures of transmission lines according to other embodiments of the disclosure.
Figure 12B:
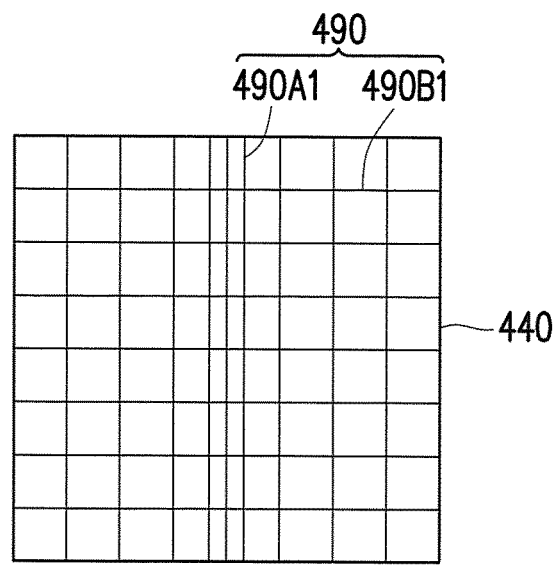
Figure 12C:
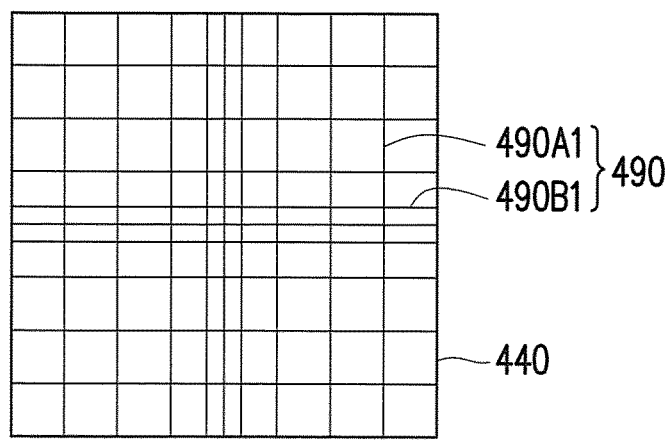

Moreover, the transmission lines 490 can be connected into a grid through a plurality of methods. For example, FIG. 11 is a schematic diagram of a grid structure of the transmission lines according to an embodiment of the disclosure. Referring to FIG. 11, the transmission lines 490 configured on the second electrode layer 440 in FIG. 3 and FIG. 10 may include a plurality of first direction transmission lines 490A and a plurality of second direction transmission lines 490B, and an extending direction of the first direction transmission lines 490A is different to an extending direction of the second direction transmission lines 490B. In this way, the first direction transmission lines 490A and the second direction transmission lines 490B may intersect with each other to form a grid. The first direction transmission lines 490A and the second direction transmission lines 490B are set in equal intervals in FIG. 11 to construct a regular grid. However, in other embodiments, as shown in FIG. 12A to FIG. 12C, the transmission lines 490 may include a plurality of first direction transmission lines 490A1 and a plurality of second direction transmission lines 490B1, and an extending direction of the first direction transmission lines 490A1 is different to an extending direction of the second direction transmission lines 490B 1. In FIG. 12A, the intervals of the first direction transmission lines 490A1 are different to the intervals of the second direction transmission lines 490B 1. In FIG. 12B, the first direction transmission lines 490A1 are arranged in variant intervals, and in FIG. 12C, the first direction transmission lines 490A1 and the second direction transmission lines 490B1 are all arranged in variant intervals. Now, the grid constructed by the first direction transmission lines 490A1 and the second direction transmission lines 490B1 have grid openings of different sizes.

Figure 13:
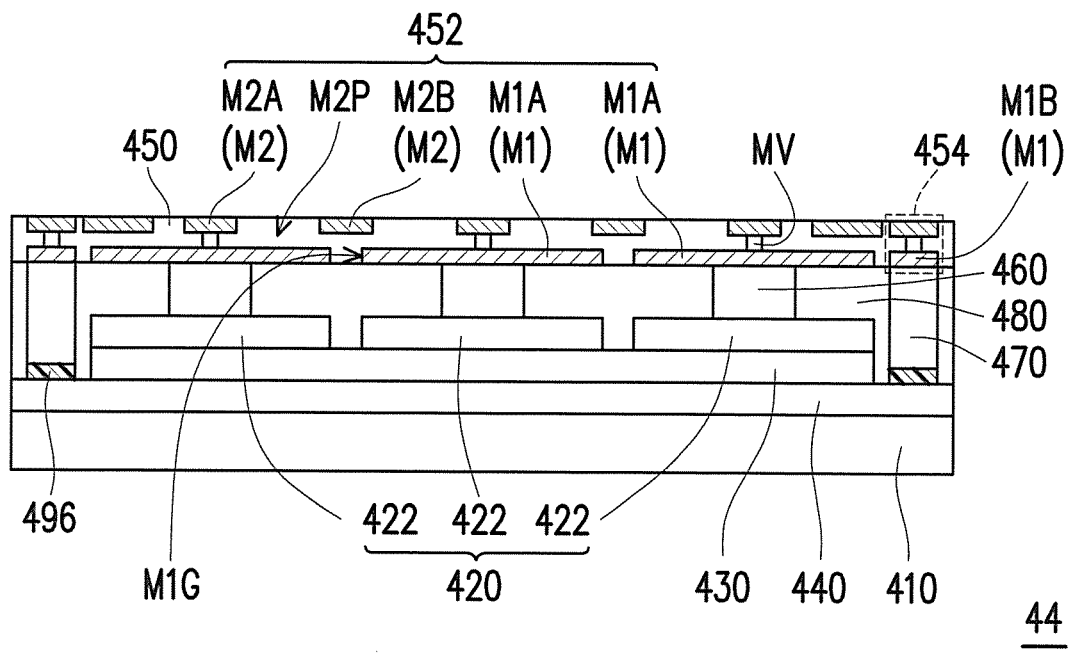
FIG. 13 is a schematic cross-sectional view of an organic light-emitting device according to still another embodiment of the disclosure.

FIG. 13 is a cross-sectional view of an organic light-emitting device according to still another embodiment of the disclosure. Referring to FIG. 13, the organic light-emitting device 44 is similar to the aforementioned organic light-emitting device 40, and includes the first substrate 410, the second electrode layer 440, the light-emitting structure layer 430, the first electrode layer 420, the second substrate 450, the first conduction members 460, the second conduction member 470, the sealing layer 480 and a connection electrode 496. The first substrate 410, the second electrode layer 440, the light-emitting structure layer 430, the first electrode layer 420, the second substrate 450, the first conduction members 460, the second conduction member 470 and the sealing layer 480 may refer to related descriptions of FIG. 2 to FIG. 6, and details thereof are not repeated. In the present embodiment, the connection electrode 496 is disposed on the second electrode layer 440, and is located outside the orthogonal projection area of the light-emitting structure layer 430. The connection electrode 496 is used for providing electrical transmission between the second electrode layer 440 and the second conduction member 470.

Figure 14:
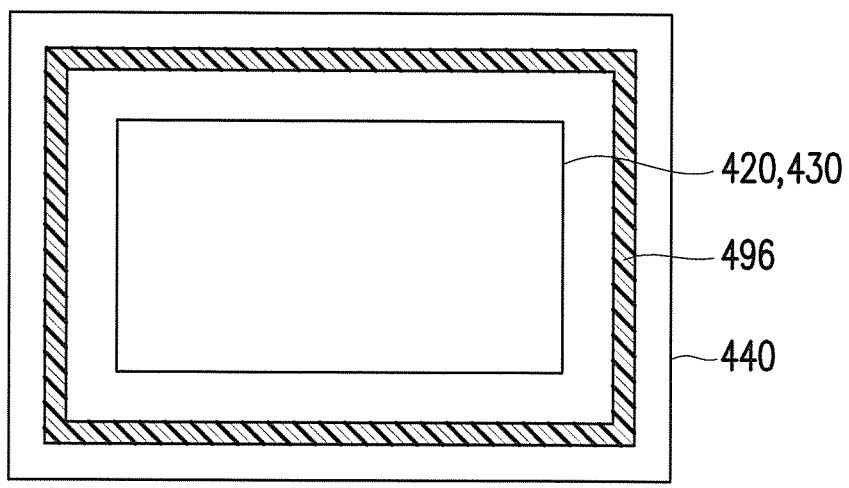
FIG. 14 is a top view of an implementation of the organic light-emitting device of FIG. 13.

FIG. 14 is a top view of an implementation of the organic light-emitting device of FIG. 13. Referring to FIG. 14 and FIG. 13, in the present embodiment, the connection electrode 496 can be set as a closed ring to surround the outside of the orthogonal projection areas of the light-emitting structure layer 430 and the first electrode layer 420. Moreover, in the present embodiment, the light-emitting structure layer 430 and the first electrode layer 420 are overlapped to each other and substantially have a same area. In other embodiments, the connection electrode 496 does not have to be set as the closed ring, but can be set as a non-closed ring or is constructed by a plurality of line segments arranged along a ring-shape path.

Figure 15:
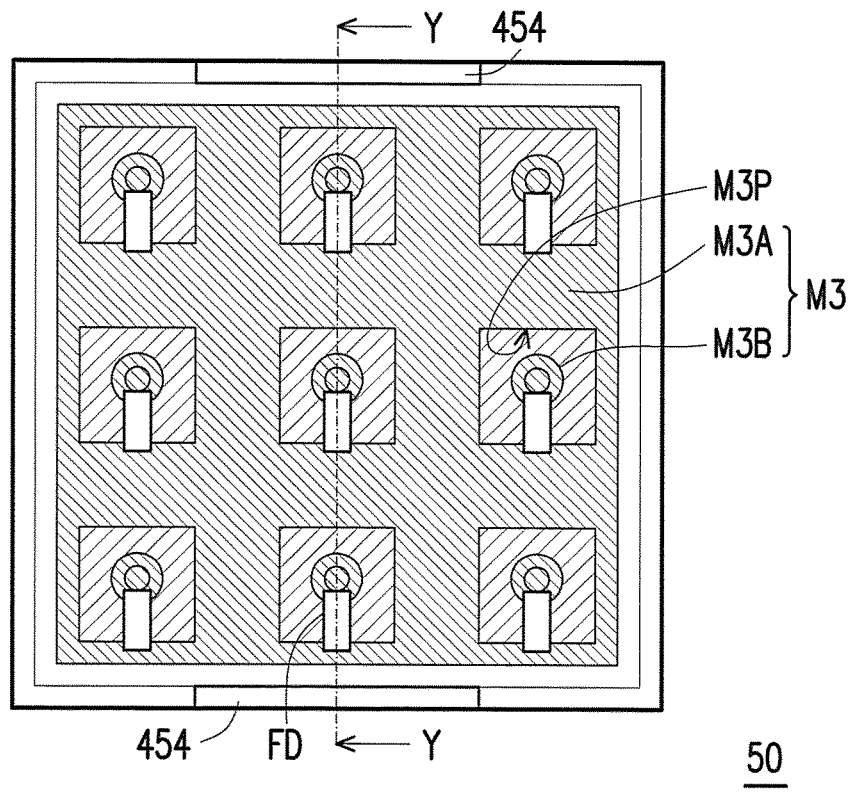
FIG. 15 is a top view of an organic light-emitting device according to another embodiment of the disclosure.
Figure 16:
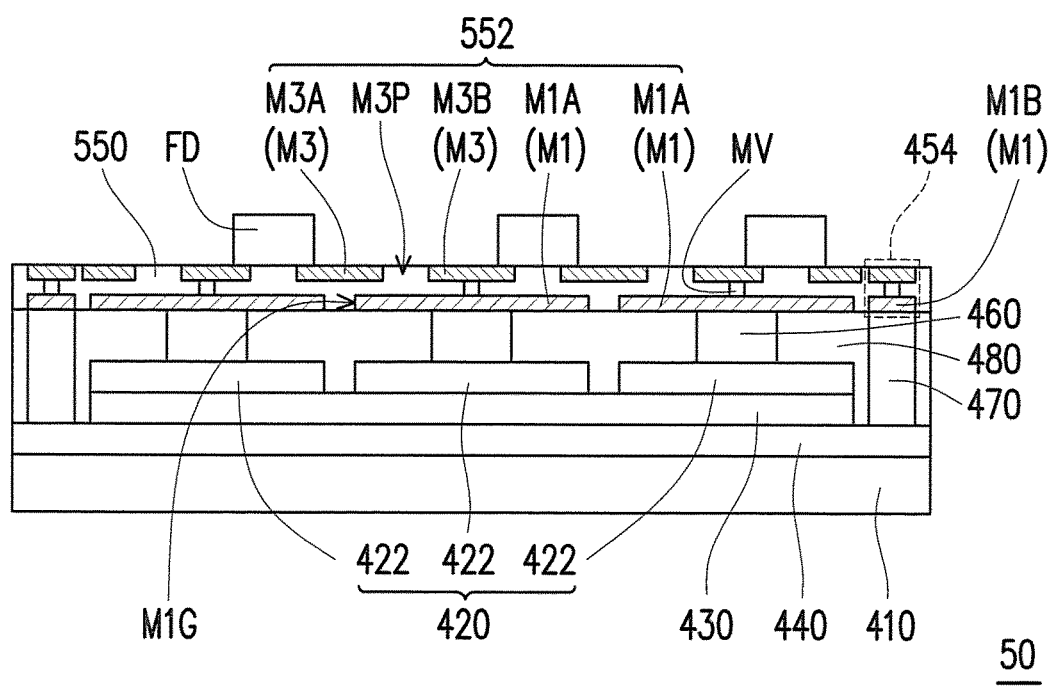
FIG. 16 is a schematic cross-sectional view of FIG. 15 along a section line Y-Y.

FIG. 15 is a top view of an organic light-emitting device according to another embodiment of the disclosure, and FIG. 16 is a cross-sectional view of FIG. 15 along a section line Y-Y. Referring to FIG. 15 and FIG. 16, the organic light-emitting device 50 is similar to the aforementioned organic light-emitting device 40, and includes the first substrate 410, the second electrode layer 440, the light-emitting structure layer 430, the first electrode layer 420, a second substrate 550, the second conduction member 470, the first conduction members 460 and the sealing layer 480. The first substrate 410, the second electrode layer 440, the light-emitting structure layer 430, the first electrode layer 420, the second conduction member 470, the first conduction members 460 and the sealing layer 480 may refer to related descriptions of FIG. 2 to FIG. 5, and details thereof are not repeated.

The first conductive layer M1 and the second conductive layer M3 are set in the second substrate 550, and the first conductive layer M1 and the second conductive layer M3 are used for constructing a first circuit 552 and a second circuit 454. The first circuit 552 is electrically connected to the first electrode layer 420 through the first conduction members 460 and the second circuit 454 is electrically connected to the second electrode layer 440 through the second conduction member 470. The first conductive layer M1 is closer to the first electrode layer 420 compared to the second conductive layer M3, and the first conductive layer M1 is exposed on the surface of the second substrate 550. Protection structures FD are disposed on an outer side of the second substrate 550. The protection structures FD are disposed on the second substrate 550 through an outer side adhering manner.

In the present embodiment, a pattern design of the first conductive layer M1 may refer to related description of the embodiment of FIG. 5. In other words, the first conductive layer M1 includes a plurality of first conductive patterns M1A and a plurality of second conductive patterns M1B independent to each other, and the first conductive patterns M1A are used for constructing a part of the first circuit 552 exposed on the second substrate 550, and the second conductive patterns M1B are used for constructing a part of the second circuit 454 exposed at the second substrate 550.

The second conductive layer M3 includes a continuous pattern M3A and a plurality of contact portions M3B. According to FIG. 15 and FIG. 16, it is known that the second conductive layer M3 has a plurality of openings M3P, and each of the openings M3P entirely surrounds one of the contact portions M3B, such that the continuous pattern M3A and the contact portions M3B are separated from each other in structure. Each of the protection structures FD is disposed between one of the contact portions M3B and the continuous pattern M3A for electrically connecting the contact portion M3B to the continuous pattern M3A or to form an open circuit between one of the contact portions M3B and the continuous pattern M3A. The protection structure FD may include a fuse, and when a current flowing through the protection structure FD is greater than a threshold, the protection structure FD is melted to form an open circuit. The protection structure FD independently serves as a member for electrically connecting a single contact portion M3B to the continuous pattern M3A. Therefore, the protection structure FD forming the open circuit may block the corresponding contact portion M3B to electrically connect the continuous pattern M3A, and other contact portions M3B are still kept being electrically connected to the continuous pattern M3A. In the case that the protection structures FD are configured, in the organic light-emitting device 50, if a local part has the current crowding phenomenon, the current transmission of the local part can be terminated under the protection mechanism of the corresponding protection structure FD, so as to avoid damage caused by the large current.

In an actual application, a designer may select suitable assemblies from the protection structures FD having known protection functions according to a required protection effect of the whole light-emitting device 50. For example, the protection structure FD can be a slow type fuse, an ordinary type fuse or a fast type fuse. Specifications of two types of fuses are listed in a following table 2.

TABLE 2

| Fuse | Hold current $I_{hold}$ (A) | Trip current $I_{trip}$ (A) | Maximum voltage $V_{max}$ (Vdc) | Maximum current $I_{max}$ (A) | Power consumption $P_d$ typ. (W) | Maximum trip time current (A) | Maximum trip time Time (S) |
|---|---|---|---|---|---|---|---|
| A | 0.05 | 0.15 | 30 | 10 | 0.60 | 0.25 | 1.50 |
| B | 0.10 | 0.30 | 30 | 10 | 0.60 | 0.50 | 1.50 |

The current threshold of the protection structure FD can be determined according to an operation current of the whole organic light-emitting device 50 and the amount of the pad-like patterns 422 in the first electrode layer 420. For example, when the driving current of the whole organic light-emitting device 50 is X and the amount of the pad-like patterns 422 in the first electrode layer 420 is N, if the current flowing through the protection structure FD is greater than X/N, it represents that the corresponding pad-like pattern 422 has the current concentration phenomenon, and the more the current flowing through the protection structure FD is close to X, the more obvious the current concentration phenomenon of the corresponding pad-like pattern 422 is. The increased current may result in a temperature increase of the portion where the corresponding pad-like pattern 422 is located to cause a damage of the organic light-emitting device 50. Therefore, the protection structure FD at least allows a current with a value of X/N to pass therethrough, and the current limit of the protection structure FD can be set within a range of greater than X/N and smaller than X. In other words, when the current flowing through the protection structure FD (i.e. the fuse) is smaller than or equal to X/N, the protection structure FD forms a close circuit, and when the current flowing through the protection structure FD is greater than X/N and smaller than X, the protection structure FD forms an open circuit. The protection structure FD of the present embodiment forms an open circuit when the current is increased, so as to avoid damage due to a high temperature caused by a large current, and prolong a service life of the organic light-emitting device 50.

In the embodiment of the disclosure, one of the electrode layers of the organic light-emitting device is divided into a plurality of independent pad-like patterns, and each of the pad-like patterns is connected out through one protection structure. The protection structure can be cut off when the current is too high or when the temperature is too high due to the high current, such that the current is not transmitted out from the corresponding pad-like pattern. Meanwhile, the protection structures not subjected to the high current or high temperature still maintain the current transmission paths, such that the organic light-emitting device can still operate. Therefore, configuration of the protection structures avails prolonging the service life of the organic light-emitting device and effectively avoiding current crowding phenomenon or temperature increase caused by the current crowding phenomenon to cause the damage of the organic light-emitting device.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An organic light-emitting device, comprising:
a first substrate;
a light-emitting structure layer, disposed on the first substrate;
a first electrode layer, disposed on the light-emitting structure layer, and comprising a plurality pad-like patterns, wherein the pad-like patterns are separated from each other;
a second electrode layer, disposed between the light-emitting structure layer and the first substrate;
a second substrate, adhered on the first electrode layer, and comprising a first circuit and a second circuit, wherein the first circuit and the second circuit are electrically independent to each other, and the first circuit comprises a continuous pattern and a plurality of contact portions, the contact portions and the continuous pattern are separated by a plurality of openings;
a plurality of first conduction members, connected between the first circuit and the first electrode layer;
a second conduction member, connected between the second circuit and the second electrode layer; and
a plurality of protection structures, respectively forming open circuits or close circuits between the contact portions and the continuous pattern.

2. The organic light-emitting device as claimed in claim 1, wherein the first circuit and the second circuit are formed by a first conductive layer and a second conductive layer, the first conductive layer is exposed on a surface of the second substrate, the first conductive layer is located between the second conductive layer and the first conduction members, and the second conductive layer constructs the contact portions and the continuous pattern.

3. The organic light-emitting device as claimed in claim 2, wherein the first conductive layer constructs a plurality of first conductive patterns and a second conductive pattern, each of the first conductive patterns is connected to one of the pad-like patterns through one of the first conduction members, and the second conductive pattern is connected to the second electrode layer through the second conduction member.

4. The organic light-emitting device as claimed in claim 3, wherein an orthogonal projection area of each of the first conductive patterns is overlapped with an orthogonal projection area of one of the pad-like patterns.

5. The organic light-emitting device as claimed in claim 3, wherein an orthogonal projection area of each of the openings is located within an orthogonal projection area of one of the first conductive patterns in the first conductive layer.

6. The organic light-emitting device as claimed in claim 2, wherein the second conductive layer further constructs the protection structures, and each of the protection structures is connected between one of the contact portions and the continuous pattern.

7. The organic light-emitting device as claimed in claim 6, wherein a temperature tolerance of the protection structures is smaller than that of the continuous pattern, the contact portions, the first conductive patterns, the first conduction members and the pad-like patterns.

8. The organic light-emitting device as claimed in claim 6, wherein each of the protection structures has a variant line width and the line width is decreased from an end portion towards a center.

9. The organic light-emitting device as claimed in claim 6, wherein each of the protection structures has a zigzag shape.

10. The organic light-emitting device as claimed in claim 1, wherein the protection structures are externally attached to a surface of the second substrate, and the protection structures and the first substrate are located at two opposite sides of the second substrate.

11. The organic light-emitting device as claimed in claim 10, wherein each of the protection structures comprises a fuse.

12. The organic light-emitting device as claimed in claim 11, wherein an amount of the pad-like patterns is N, and when a driving current of the organic light-emitting device is X, and a current flowing through the fuse is smaller than or equal to X/N, the fuse forms a close circuit, and when the current flowing through the fuse is greater than X/N and smaller than X, the fuse forms an open circuit.

13. The organic light-emitting device as claimed in claim 1, wherein the protection structures respectively have a variable resistance value, and the variable resistance value is increased as a temperature of the protection structures is increased.

14. The organic light-emitting device as claimed in claim 1, further comprising:

a sealing layer, disposed between the first substrate and the second substrate, wherein the first conduction members and the second conduction member all penetrate through the sealing layer.

15. The organic light-emitting device as claimed in claim 1, further comprising:
   at least one transmission line, disposed between the light-emitting structure layer and the second electrode layer.

16. The organic light-emitting device as claimed in claim 15, wherein the at least one transmission line is connected into a grid.

17. The organic light-emitting device as claimed in claim 16, wherein the at least one transmission line comprises a plurality of first direction transmission lines and a plurality of second direction transmission lines, an extending direction of the first direction transmission lines is different to an extending direction of the second direction transmission lines, and the first direction transmission lines and the second direction transmission lines are arranged in different intervals.

18. The organic light-emitting device as claimed in claim 17, wherein at least one of the first direction transmission lines and the second direction transmission lines is arranged in a variant interval.

19. The organic light-emitting device as claimed in claim 15, further comprising:
   an insulation structure, disposed between the at least one transmission line and the light-emitting structure layer, and disposed along with a contour of the at least one transmission line.

20. The organic light-emitting device as claimed in claim 15, further comprising:
   an auxiliary conductive layer, disposed between the second electrode layer and the light-emitting structure layer, and covering the at least one transmission line.

21. The organic light-emitting device as claimed in claim 1, further comprising:
   a connection electrode, disposed on the second electrode layer, and located outside an orthogonal projection area of the light-emitting structure layer.

22. The organic light-emitting device as claimed in claim 1, wherein an orthogonal projection area of the light-emitting structure layer and an orthogonal projection area of the first electrode layer are both located within an orthogonal projection area of the second electrode layer.

23. A repairing process for an organic light-emitting device, comprising:
   determining a target point on the organic light-emitting device, wherein the organic light-emitting device, comprising:
      a first substrate;
      a light-emitting structure layer, disposed on the first substrate;
      a first electrode layer, disposed on the light-emitting structure layer, and comprising a plurality pad-like patterns, wherein the pad-like patterns are separated from each other;
      a second electrode layer, disposed between the light-emitting structure layer and the first substrate;
      a second substrate, adhered on the first electrode layer, and comprising a first circuit and a second circuit, wherein the first circuit and the second circuit are electrically independent to each other, and the first circuit comprises a continuous pattern and a plurality of contact portions, the contact portions and the continuous pattern are separated by a plurality of openings;
      a plurality of first conduction members, connected between the first circuit and the first electrode layer;
      a second conduction member, connected between the second circuit and the second electrode layer; and
   performing an optical treatment on the target point to form a void at where the target point is.

* * * * *